(12) United States Patent
Blamon et al.

(10) Patent No.: US 12,273,089 B2
(45) Date of Patent: Apr. 8, 2025

(54) INTEGRATED CIRCUIT COMPRISING AN ADAPTATION AND FILTERING NETWORK AND CORRESPONDING ADAPTATION AND FILTERING PROCESS

(71) Applicant: STMicroelectronics International N.V., Geneva (CH)

(72) Inventors: Guillaume Blamon, Courbevoie (FR); Emmanuel Picard, Tours (FR); Christophe Boyavalle, Triel sur seine (FR)

(73) Assignee: STMicroelectronics International N.V., Geneva (CH)

( * ) Notice: Subject to any disclaimer, the term of this patent is extended or adjusted under 35 U.S.C. 154(b) by 289 days.

(21) Appl. No.: 17/800,277

(22) PCT Filed: Feb. 15, 2021

(86) PCT No.: PCT/EP2021/053672
§ 371 (c)(1),
(2) Date: Aug. 17, 2022

(87) PCT Pub. No.: WO2021/165210
PCT Pub. Date: Aug. 26, 2021

(65) Prior Publication Data
US 2023/0129447 A1    Apr. 27, 2023

(30) Foreign Application Priority Data

Feb. 17, 2020   (EP) .................................... 20157648

(51) Int. Cl.
*H03H 7/38*         (2006.01)
*H03F 1/56*         (2006.01)
(Continued)

(52) U.S. Cl.
CPC ............... *H03H 7/38* (2013.01); *H03F 1/565* (2013.01); *H03F 3/245* (2013.01);
(Continued)

(58) Field of Classification Search
None
See application file for complete search history.

(56) References Cited

U.S. PATENT DOCUMENTS 3,461,372 A     8/1969  Pickup et al.
5,973,568 A *  10/1999  Shapiro .................. H04B 1/005
                                                        330/295

(Continued)

FOREIGN PATENT DOCUMENTS

WO        2021165210 A1      8/2021

*Primary Examiner* — Tuan A Tran
(74) *Attorney, Agent, or Firm* — Slater Matsil, LLP

(57) ABSTRACT

The integrated circuit includes a power amplifier intended to provide a signal in a fundamental frequency band, an antenna, and a matching and filtering network having a first section, a second section, and a third section. The three sections include LC arrangements configured to have an impedance matched to the power amplifier's output in the fundamental frequency band. The LC arrangements of the first section and the second section are configured to have resonant frequencies adapted to attenuate the harmonic frequency bands of the fundamental frequency band.

20 Claims, 3 Drawing Sheets

(51) Int. Cl.
  *H03F 3/24* (2006.01)
  *H03H 7/01* (2006.01)
  *H03H 11/34* (2006.01)
  *H04B 1/44* (2006.01)

(52) U.S. Cl.
  CPC ..... *H03H 7/0115* (2013.01); *H03F 2200/387* (2013.01); *H03F 2200/451* (2013.01)

(56) References Cited

U.S. PATENT DOCUMENTS

| | | | | |
|---|---|---|---|---|
| 8,115,572 | B2* | 2/2012 | Morris, III | H03H 7/1708 |
| | | | | 333/204 |
| 8,207,798 | B1* | 6/2012 | Wright | H03F 1/565 |
| | | | | 333/32 |
| 8,855,584 | B2* | 10/2014 | Harris | H04B 1/0458 |
| | | | | 455/107 |
| 8,963,644 | B2* | 2/2015 | Ma | H03G 3/008 |
| | | | | 330/302 |
| 9,231,550 | B2* | 1/2016 | Ma | H03F 3/195 |
| 9,294,056 | B2* | 3/2016 | Nobbe | H03F 1/223 |
| 9,503,025 | B2* | 11/2016 | Cao | H03F 3/245 |
| 9,692,392 | B2* | 6/2017 | Cabanillas | H03F 1/56 |
| 9,742,375 | B2* | 8/2017 | Manssen | H03H 7/38 |
| 2005/0282503 | A1 | 12/2005 | Onno et al. | |
| 2014/0073267 | A1 | 3/2014 | Cabanillas et al. | |
| 2016/0013758 | A1 | 1/2016 | Cao et al. | |

* cited by examiner

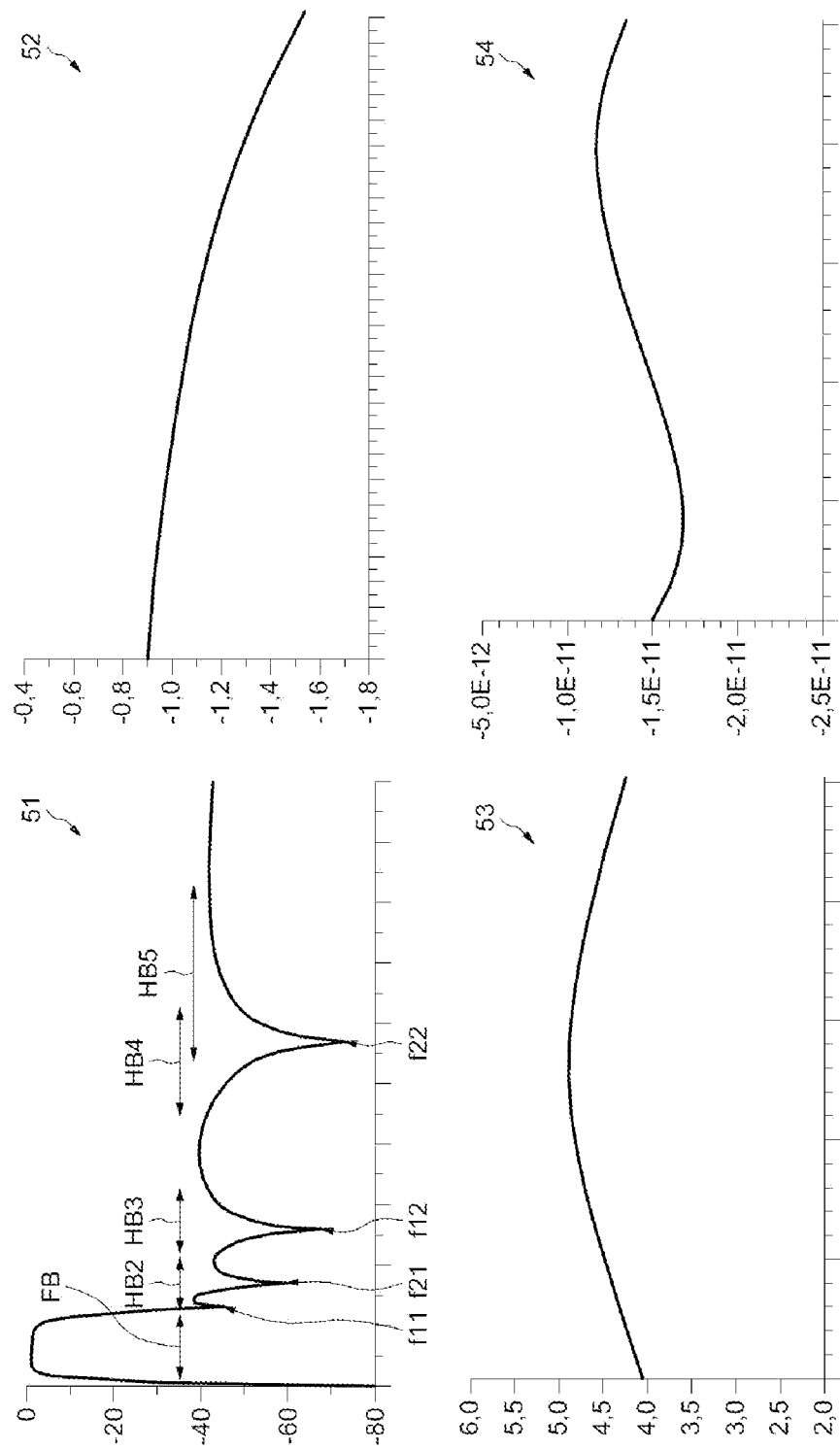

INTEGRATED CIRCUIT COMPRISING AN ADAPTATION AND FILTERING NETWORK AND CORRESPONDING ADAPTATION AND FILTERING PROCESS

CROSS-REFERENCE TO RELATED APPLICATIONS

This application is a national stage of International Application No. PCT/EP2021/053672, filed on Feb. 15, 2021, which claims priority to European Patent Application No. 20157648.5, filed on Feb. 17, 2020, which applications are hereby incorporated by reference herein in their entirety.

TECHNICAL FIELD

Embodiments and implementations relate to integrated circuits including a matching and filtering network, typically between an output of a power amplifier and an antenna.

BACKGROUND

On the one hand, power amplifiers operate at maximum efficiency when the load on the outputs thereof is at optimum impedance. The optimum impedance at the output of a power amplifier typically differs from the impedance of the antennas connected thereto.

As a result, impedance matching circuits are conventionally provided between the output of the power amplifiers and the antennas in order to transform the impedances of the antennas into the ideal impedances of the amplifiers. Impedance matching circuits are typically produced using passive components such as resistive elements, inductive elements and capacitive elements. Impedance matching circuits occupy a potentially large surface area, which can be particularly detrimental when the impedance matching circuit is produced in a small integrated circuit.

On the other hand, the emission spectra of the power amplifiers typically contain interfering signals, such as harmonic frequencies of the fundamental frequency or noise due to the internal non-linearity of the power amplifiers.

As a result, filtering circuits are conventionally provided between the output of the power amplifiers and the antennas in order to filter in particular the harmonic frequency bands, for example up to the fifth order. The filtering circuits are typically produced using passive components such as resistive elements, inductive elements, and capacitive elements, and also occupy a potentially large surface area which is particularly detrimental when the impedance matching circuit is produced in an integrated manner.

Impedance matching and filtering circuits have specific constraints and are conventionally designed separately.

Although techniques separating the two functions (impedance matching and filtering) are satisfactory in terms of performance, these techniques require numerous passive components, making them expensive and cumbersome.

However, reducing the size of the integrated circuits reduces the surface area available for the passive devices, making it more difficult to integrate the two functions with satisfactory performance levels.

The use of Surface Acoustic Wave (SAW) filters reduces the space required, however increases costs.

As a result, there is a need for compact and inexpensive solutions that can implement impedance matching and filtering and procure good performance levels.

SUMMARY

According to embodiments and implementations, the invention proposes providing impedance matching and filtering in a single network, wherein impedance matching is provided by a network with a minimum quality factor, in order to obtain the best response over the widest possible frequency range while keeping the number of passive elements as low as possible; filtering is provided by replacing passive elements with inductor-capacitor arrangements wisely chosen so as to resonate at the frequencies to be filtered without modifying the impedance transformation in the transmission frequencies. In particular, the resonant frequencies of the inductor-capacitor arrangements are chosen so as to optimise the size and response of the network.

In this respect, one aspect proposes an integrated circuit including a power amplifier intended to provide a signal in a fundamental frequency band, an antenna, and a matching and filtering network including:

a first section between an output node of the power amplifier and a first intermediate node, a second section between the first intermediate node and a second intermediate node, and a third section between the second intermediate node and an input node of the antenna, the three sections including inductor-capacitor "LC" arrangements configured to have an impedance that is matched to the output of the power amplifier in the fundamental frequency band. The LC arrangements of the first section and of the second section are furthermore configured to have resonant frequencies that are respectively adapted to attenuate the harmonic frequency bands of the fundamental frequency band.

For convenience and in accordance with conventional use in electronics, the notation "LC" is used to designate the terms "inductor-capacitor".

Thus, a matching and filtering network with three LC arrangement sections is proposed, wherein all of the LC arrangements of the first section and of the second section are configured for both impedance matching and harmonic frequency filtering.

In particular, it should be noted that all of the LC arrangements of each of the first and second sections are configured for the simultaneous matching and filtering functions, unlike conventional techniques wherein one arrangement is dedicated to matching and another, at least partially separate, arrangement is dedicated to filtering.

The third section is dedicated to impedance matching and, in particular, is not configured to have a resonant frequency, in order to maintain high frequency attenuation.

As a result, the design according to this aspect, which proposes a complete merging of the matching and filtering functions in the LC arrangements of the first section and of the second section, allows a particularly compact integrated circuit to be produced, without loss of performance or increase in cost.

According to one embodiment, the LC arrangements of the first section are configured to have resonant frequencies that are lower than the resonant frequencies of the corresponding LC arrangements of the second section.

More specifically, for impedance matching, the capacitive elements are usually larger on the power amplifier side, in the first section, than on the antenna side, in the second section. On the other hand, the resonant frequency of an LC arrangement is inversely proportional to the size of the inductive and capacitive elements of the LC arrangement. As a result, this embodiment proposes positioning the resonant frequencies in an optimised manner for the sizes of the inductive elements provided for filtering. The overall space requirement is thus optimised to be as low as possible.

According to one embodiment, the first section includes a parallel LC arrangement coupled between the output node of the power amplifier and the first intermediate node, and a series LC arrangement coupled between the first intermediate node and a ground node, and the second section includes a parallel LC arrangement coupled between the first intermediate node and the second intermediate node, and a series LC arrangement coupled between the second intermediate node and the ground node.

Thus, the parallel LC arrangements block signals at the resonant frequencies thereof, whereas the series LC arrangements route signals at the resonant frequencies thereof to ground.

According to one embodiment, each series LC arrangement is configured to have an equivalent impedance corresponding to an impedance of a capacitive element adapted for said impedance matching in the fundamental frequency band, and wherein the resonant frequencies of each series LC arrangement are chosen so as to be distributed in different harmonic frequency bands of the fundamental frequency band, and such that the series LC arrangements having equivalent impedances corresponding to the impedances of the capacitive elements having the smallest capacitive values have the largest resonant frequencies.

In other words, the resonant frequency of the series LC arrangements in the first section and in the second section is chosen so as to incorporate an inductive element of minimal size in combination with a capacitive element provided for impedance matching.

More specifically, since the value of the inductive element required to resonate a capacitive element is inversely proportional to the capacitive value and to the square of the resonant frequency, the highest resonant frequencies are advantageously associated with the lowest capacitive values, in order to minimise the value of the inductive element to be added.

This embodiment again proposes optimising the overall space requirement by positioning the resonant frequencies in a way that is optimised for the sizes of the inductive elements enabling the filtering function in each of the first and second sections.

According to one embodiment, the resonant frequencies of each parallel LC arrangement are chosen such that they are distributed, with the resonant frequencies of the series LC arrangements, in different harmonic frequency bands of the fundamental frequency band.

Thus, this embodiment allows filtering over all harmonic frequency bands to be covered, by positioning the resonant frequencies within the harmonic frequency bands still to be filtered, by combining capacitive elements with inductive elements provided for impedance matching.

More specifically, since the inductive elements typically occupy much more space than capacitive elements, the positioning of the resonant frequencies with the capacitive value in the parallel LC arrangements leads to an additional space requirement of acceptable magnitude compared to the space required by the equivalent inductive elements provided for impedance matching, and also compared to the space saved by optimising the inductive elements in series LC filters.

According to one embodiment, the LC arrangements of the first section and of the second section are configured according to at least one of the following criteria: the parallel LC arrangement of the first section is configured to have a resonant frequency in one half of the second harmonic frequency band; the parallel LC arrangement of the second section is configured to have a resonant frequency in the other half of the second harmonic frequency band; the series LC arrangement of the first section is configured to have a resonant frequency in the third harmonic frequency band; the series LC arrangement of the second section is configured to have a resonant frequency either between the fourth harmonic frequency band and the fifth harmonic frequency band, or in a common portion of the fourth harmonic frequency band and of the fifth harmonic frequency band.

This embodiment offers possibilities for positioning the resonant frequencies to optimise the overall space requirement, and for optimum performance.

In particular, the positioning of the resonant frequency of the series LC arrangement of the first section in the third harmonic frequency band, and not in the top half of the second harmonic frequency band should be noted. This positioning advantageously prevents potential coupling problems between the resonant frequency of the parallel LC arrangement of the first section (which is in the second harmonic frequency band), and the resonant frequency of the series LC arrangement of the first section (which is not in the second harmonic frequency band).

According to one embodiment, the third section includes an LC arrangement comprising an inductive element coupled between the second intermediate node and the input node of the antenna, and a capacitive element coupled between the input node of the antenna and a ground node, the LC arrangement of the third section being configured to have a minimum quality factor.

According to another aspect, the invention proposes a method for impedance matching and filtering between an output of a power amplifier providing a signal in a fundamental frequency band and an antenna, comprising a dimensioning of a virtual matching network including: a first section between an output node of the power amplifier and a first intermediate node, a second section between the first intermediate node and a second intermediate node, and a third section between the second intermediate node and an input node of the antenna, each of the three sections including an inductive element and a capacitive element, the dimensioning being produced so as to have an impedance that is matched to the output of the power amplifier in the fundamental frequency band, wherein the method comprises producing a real matching and filtering network comprising replacing each inductive element and each capacitive element of the first section and of the second section of the virtual matching network, with respective "LC" inductor-capacitor arrangements, configured to have an equivalent impedance matched to the output of the power amplifier in the fundamental frequency band, and to further have resonant frequencies respectively adapted to attenuate the harmonic frequency bands of the fundamental frequency band.

The method according to this aspect proposes a dimensioning of a virtual impedance matching network, not providing the filtering function, in order to dimension the requirements for impedance matching.

The term "virtual" is understood to mean, for example, "that which exists in the state of mere possibility or eventuality, but not in the state of material realisation", such as in particular an intermediate calculation.

The filtering is then introduced into the real, i.e. as opposed to the "virtual", matching and filtering network, which really exists for matching and filtering a transmission signal. This real matching and filtering network is obtained by replacing the virtual elements with real elements that are equivalent for the impedance matching needs, and that additionally have filtering functions.

In practice, this method allows the matching and filtering functions to be fully merged in the LC arrangements of the first section and of the second section in a compact, efficient and inexpensive manner, for any embodiment of the power amplifier and antenna.

According to one implementation, the resonant frequencies of the LC arrangements of the first section of the real matching and filtering network are chosen so as to be lower than the resonant frequencies of the corresponding LC arrangements of the second section of the real matching and filtering network.

According to one implementation, the first section of the virtual matching network includes an inductive element coupled between the output node of the power amplifier and the first intermediate node, and a capacitive element coupled between the first intermediate node and a ground node, and the second section of the virtual matching network includes an inductive element coupled between the first intermediate node and the second intermediate node and a capacitive element coupled between the second intermediate node and the ground node, and wherein said production of the real matching and filtering network comprises replacing each inductive element by a parallel LC arrangement, and replacing each capacitive element by a series LC arrangement.

According to one implementation, the resonant frequencies are firstly chosen for each series LC arrangement so as to be distributed in different harmonic frequency bands of the fundamental frequency band, and so that the series LC arrangements replacing the capacitive elements of the virtual matching network having the smallest capacitive values, have the largest resonant frequencies.

According to one implementation, the resonant frequencies are then chosen for each parallel LC arrangement such that they are distributed, with the resonant frequencies of the series LC arrangements, in different harmonic frequency bands of the fundamental frequency band.

According to one implementation, the real matching and filtering network is produced according to at least one of the following criteria: the parallel LC arrangement of the first section has a resonant frequency in one half of the second harmonic frequency band; the parallel LC arrangement of the second section has a resonant frequency in the other half of the second harmonic frequency band; the series LC arrangement of the first section has a resonant frequency in the third harmonic frequency band; the series LC arrangement of the second section has a resonant frequency either between the fourth harmonic frequency band and the fifth harmonic frequency band, or in a common portion of the fourth harmonic frequency band and of the fifth harmonic frequency band.

According to one implementation, the production of the real matching and filtering network comprises reproducing the third section of the virtual matching network including an inductive element coupled between the second intermediate node and the input node of the antenna, and a capacitive element coupled between the input node of the antenna and a ground node, the LC arrangement of the third section being dimensioned so as to have a minimum quality factor.

BRIEF DESCRIPTION OF THE DRAWINGS

Other advantages and features of the invention will become apparent upon examining the detailed description of non-limiting embodiments and implementations, and from the accompanying drawings in which:

FIG. 5 are graphs of the embodiment matching network.

DETAILED DESCRIPTION OF ILLUSTRATIVE EMBODIMENTS

Figure 1:
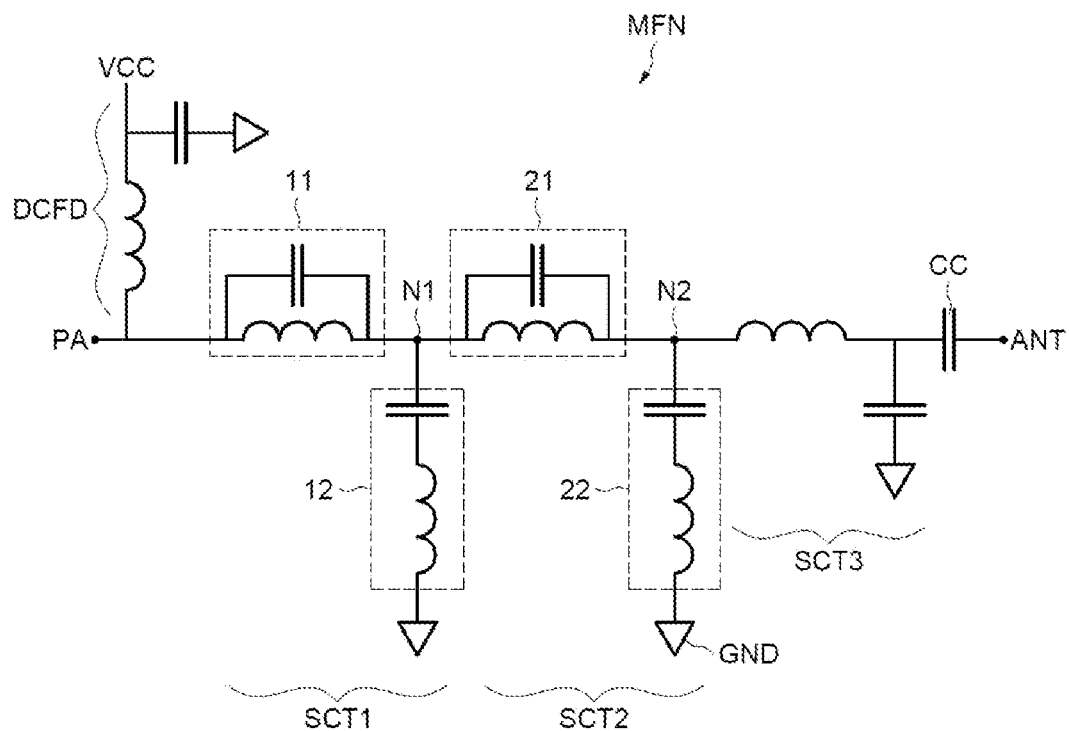
FIG. 1 is a schematic of an embodiment matching and filtering circuit.

FIG. 1 shows a matching and filtering network MFN between an output node of a power amplifier PA and an input node of an antenna ANT, for example integrated into an integrated circuit.

The power amplifier PA is configured to provide a transmission signal in a fundamental frequency band, in particular radio frequencies adapted for wireless communications, such as 4G, 5G or LTE, Wi-Fi or Bluetooth telecommunications for example.

The matching and filtering network MFN includes three matching and filtering sections SCT1, SCT2, SCT3, and a direct current power supply stage DCFD.

The direct current power supply stage DCFD includes an inductive element in series between a supply voltage terminal VCC and the output node of the power amplifier, and a capacitive element between the supply voltage terminal VCC and a ground reference voltage terminal GND.

The direct current power supply stage DCFD allows the necessary voltage level and current for the matching and filtering network MFN to be supplied from the output node of the power amplifier PA.

The first section SCT1 is located between the output node of the power amplifier PA and a first intermediate node N1, the second section SCT2 is located between the first intermediate node N1 and a second intermediate node N2, and the third section SCT3 is located between the second intermediate node N2 and an input node of the antenna ANT.

Each of the three sections SCT1, SCT2, SCT3 includes inductive elements and capacitive elements, i.e. inductor-capacitor arrangements that will conventionally be referred to as "LC" arrangements for convenience.

The LC arrangements of the three sections SCT1, SCT2, SCT3 are configured to have an impedance that is matched to the output of the power amplifier PA in the fundamental frequency band.

The impedance is matched to the output of the power amplifier PA in that at this impedance, the optimum power of the transmission signal is transferred from the power amplifier PA to the antenna ANT, in particular in order to ensure minimum reflection of the power of the transmission signal.

Moreover, the LC arrangements of the first section SCT1 and of the second section SCT2 are furthermore configured to have resonant frequencies that are respectively adapted to attenuate the harmonic frequency bands of the fundamental frequency band.

Harmonic frequencies are integer multiples of the fundamental frequency of the transmission signal.

In particular, the first section SCT1 includes a parallel LC arrangement 11 coupled between the output node of the power amplifier PA and the first intermediate node N1, as well as a series LC arrangement 12 coupled between the first intermediate node N1 and a ground node GND.

Similarly, the second section SCT2 includes a parallel LC arrangement 21 coupled between the first intermediate node N1 and the second intermediate node N2, as well as a series LC arrangement 22 coupled between the second intermediate node N2 and the ground node GND.

The third section SCT3 includes an inductive element coupled between the second intermediate node N2 and the input node of the antenna ANT, as well as a capacitive element coupled between the input node of the antenna ANT and the ground GND.

The LC arrangement of the third section is configured to have a minimum quality factor, i.e. it is not intended to provide a filtering function at a resonant frequency, but nevertheless allows attenuation to be maintained at high and very high frequencies. The LC arrangement of the third section is dedicated to impedance matching.

It should be noted that a coupling capacitor CC is conventionally provided between the input node of the antenna ANT and the antenna, to block the direct current component of the voltage, and the capacitive value thereof is chosen such that it is large enough to have a negligible impact on impedance matching.

Thus, the parallel LC arrangements 11, 21 will block the transmission of the signals at the resonant frequencies thereof along the serial channel from the output of the power amplifier PA to the antenna ANT, via the intermediate nodes N1, N2.

Moreover, the series LC arrangements 12, 22 will route the signals at the resonant frequencies thereof flowing from the output of the power amplifier PA to the antenna ANT, via the intermediate nodes N1, N2, to ground GND (conventionally referred to as a shunt).

According to one advantageous example embodiment, each parallel LC arrangement 11, 21 is configured in a dual manner to have, on the one hand, an equivalent impedance corresponding to an impedance of an inductive element intended for said impedance matching in the fundamental frequency band (FIG. 2), and, on the other hand, to have a resonant frequency f11, f21 (FIG. 5) chosen in one of the harmonic frequency bands (FIG. 5).

Similarly, each series LC arrangement 12, 22 is advantageously configured in a dual manner to have, on the one hand, an equivalent impedance corresponding to an impedance of a capacitive element adapted for said impedance matching in the fundamental frequency band (FIG. 2), and to have a resonant frequency f12, f22 (FIG. 5) chosen in one of the harmonic frequency bands (FIG. 5) for minimising the inductive value of the series LC arrangement to this equivalent impedance.

In particular, it should be noted that each LC arrangement 11, 12, 21, 22 of the first section SCT1 and of the second section SCT2 are configured, as a whole, simultaneously for the matching and filtering functions. That is to say that there are no components in the LC arrangements of the first section SCT1 and of the second section SCT2 that are dedicated solely to the impedance matching function or solely to the filtering function.

Figure 2:
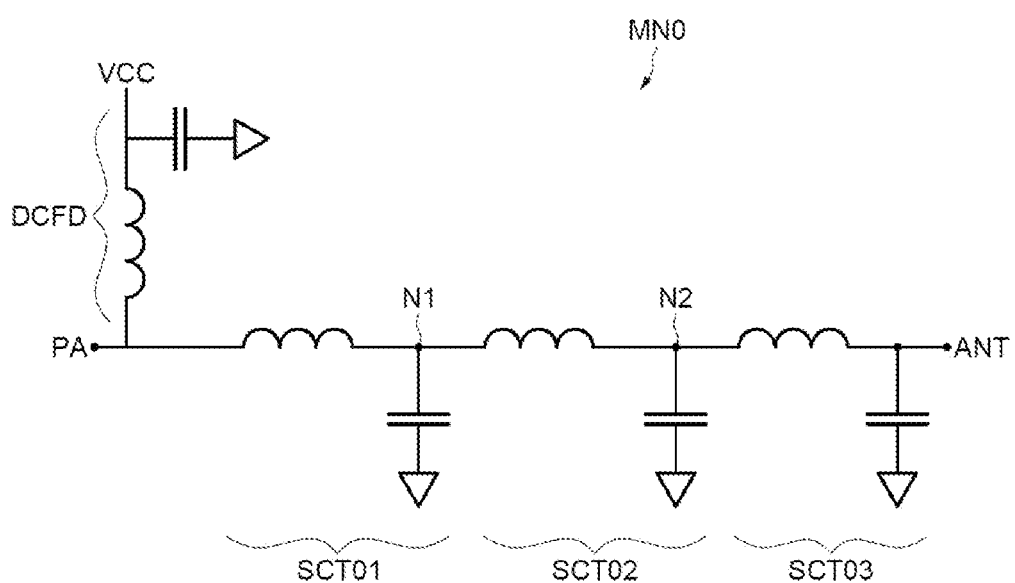
FIG. 2 is a schematic of an embodiment virtual matching network.
Figure 3:
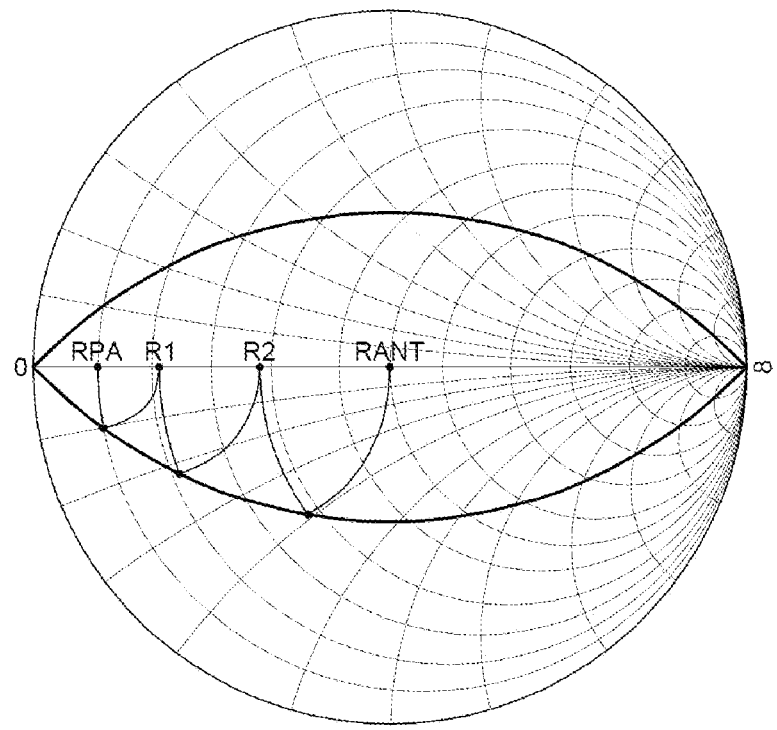
FIG. 3 is a Smith Chart plot of an embodiment normalized antenna impedance.
Figure 4:
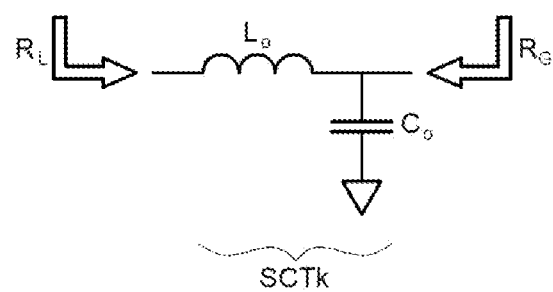
FIG. 4 is a schematic of an embodiment circuit.

Reference is made to FIGS. 2 to 4 to show an advantageous method of dimensioning the inductive and capacitive elements of the impedance matching and filtering network MFN described hereinabove with reference to FIG. 1.

FIG. 2 shows a virtual matching network MN0 which will act as a reference base for dimensioning the inductive and capacitive elements of the matching and filtering network MFN described with reference to FIG. 1.

The matching network MN0 is described as "virtual" because this network is only used for calculation purposes in order to size the impedance matching requirements. The results of the dimensioning will be used as a basis of calculation for assessing the components actually produced to implement the matching and filtering by the network MFN described with reference to FIG. 1.

The virtual matching network MN0 includes three virtual matching sections SCT01, SCT02, SCT03, and a direct current power supply stage DCFD.

The three virtual sections SCT01, SCT02, SCT03 are similar to the structure of the third section SCT3, i.e. they each include an inductive element on the serial channel from the output node of the power amplifier PA to the input node of the antenna ANT, via the intermediate nodes N1, N2, and a capacitive element shunt-coupled to ground GND, and on the intermediate nodes N1, N2 and the input node of the antenna ANT.

The virtual matching network MN0 thus corresponds to a low-pass network with a minimum quality factor in three sections SCT01, SCT02, SCT03 provided to match the impedance between the output of the power amplifier PA and the antenna ANT.

Reference is now made to FIG. 3.

FIG. 3 shows a Smith chart normalised by the impedance of the antenna ANT, so that the impedance of the antenna RANT is located in the centre of the Smith chart.

Dimensioning is carried out in such a way that the impedance of the antenna RANT is transformed into the ideal impedance of the power amplifier RPA.

For this purpose, intermediate impedances R1, R2 are calculated by the geometrical mean between the antenna impedance RANT and the ideal impedance RPA presented on the output node of the power amplifier PA.

In other words:

$$R1=(RA^2 \times RL)^{1/3}$$

$$R2=(RA \times RL^2)^{1/3}$$

Strictly speaking, the calculation is carried out with RPA being the inverse of the real part of the admittance presented at the output node of the power amplifier PA, and RANT being the inverse of the real part of the admittance presented by the antenna ANT.

The intermediate impedances R1, R2 correspond to the impedances (strictly speaking to the inverse of the real parts of the admittances) that will be presented on the intermediate nodes N1, N2 of the virtual matching network MN0.

The values of the capacitive elements C0 and of the inductive elements Lo are derived for each section SCT01, SCT02, SCT03 (or SCTk—FIG. 4) by reading the Smith chart, and by the equations EQ1 and EQ2 defined with reference to FIG. 4.

$$C_0 = \frac{1}{R_G \cdot \omega} \times \sqrt{\frac{R_G}{R_L} - 1} \qquad \text{EQ 1}$$

$$L_0 = \frac{R_L}{\omega} \times \sqrt{\frac{R_G}{R_L} - 1} \qquad \text{EQ 2}$$

Where ω is the angular frequency at a frequency (f0) chosen from the fundamental frequency band, RL is the impedance (strictly speaking the inverse of the real part of the admittance) presented to the left of each section SCTk (k∈ [01; 02; 03]), and RG is the impedance (strictly speaking the inverse of the real part of the admittance) presented to the right of each section SCTk, as shown in FIG. 4.

The imaginary part of the admittance of the load on the output node of the power amplifier PA is produced by the inductive element of the direct current power supply stage DCFD, by which the power amplifier PA is powered.

The method then comprises producing the real matching and filtering network MFN, as described hereinabove with reference to FIG. 1, from the inductive Lo and capacitive C0 elements thus dimensioned in each section SCT01, SCT02, SCT03 of the virtual matching network MN0.

Reference is made, in this respect, to FIGS. 1 and 2.

The production of the real matching and filtering network MFN comprises replacing each inductive element and each capacitive element of the first section SCT01 and of the second section SCT02 of the virtual matching network MN0, by respective resonant inductor-capacitor "LC" arrangements. The inductor-capacitor "LC" arrangements are configured to have an impedance equivalent to the matched impedance of the virtual matching network MN0 in the fundamental frequency band, and to further have resonant frequencies respectively adapted to attenuate the harmonic frequency bands of the fundamental frequency band.

In particular, the inductive elements Lo of the virtual matching network MN0 are replaced by parallel LC arrangements 11, 12 having the same impedance at a frequency f0 chosen within the fundamental frequency band, and a respective resonant frequency fr.

The inductive values L and the capacitive values C of the components of the parallel LC arrangements 11, 21 are given, for each section SCT1, SCT2, by the equations EQ3 and EQ4.

$$L = L_0\left[1 - \left(\frac{f_0}{f_r}\right)^2\right] \quad \text{EQ 3}$$

$$C = \frac{1}{L_0\left((2\pi f_r)^2 - (2\pi f_0)^2\right)} \quad \text{EQ 4}$$

Where Lo is the inductive value of the inductive element respectively replaced in each section SCT01, SCT02, f0 is a frequency in the fundamental frequency band, and fr is the resonant frequency of the respective parallel LC arrangement.

Moreover, in particular, the capacitive elements $C_o$ of the virtual matching network MN0 are replaced by series LC arrangements 12, 22, having the same impedance at a frequency $f_o$ chosen within the fundamental frequency band, and a resonance at a respective resonant frequency $f_r$.

The capacitive values C and the inductive values L of the components of the series LC arrangements 12, 22 are given, for each section SCT1, SCT2, by the equations EQ5 and EQ6

$$C = C_0\left[1 - \left(\frac{f_0}{f_r}\right)^2\right] \quad \text{EQ 5}$$

$$L = \frac{1}{C_0\left((2\pi f_r)^2 - (2\pi f_0)^2\right)} \quad \text{EQ 6}$$

Where $C_o$ is the capacitive value of the capacitive element respectively replaced in each section SCT01, SCT02, $f_o$ is a frequency in the fundamental frequency band, and $f_r$ is the resonant frequency of the respective parallel LC arrangement.

The resonant frequencies fr are chosen to attenuate the harmonic frequency bands of the fundamental frequency band.

Reference is now made to FIG. 5.

FIG. 5 shows the results of the matching and filtering network MFN as described with reference to FIG. 1 and obtained as described with reference to FIG. 2 to 4, with an advantageous positioning of the resonant frequencies (fr) f11, f12, f21, f22.

Graph 51 shows the transmission gain of the matching and filtering network MFN, graph 52 shows the transmission gain of the network MFN in the fundamental frequency band FB, graph 53 shows the real part of the impedance of the network MFN in the fundamental frequency band FB, and graph 54 shows the imaginary part of the impedance of the network MFN in the fundamental frequency band FB.

The resonant frequency of the parallel LC arrangement 11 of the first section SCT1 is denoted f11, the resonant frequency of the series LC arrangement 12 of the first section SCT1 is denoted f12, the resonant frequency of the parallel LC arrangement 21 of the second section SCT2 is denoted f21, and the resonant frequency of the series LC arrangement 22 of the second section SCT2 is denoted f22 (with reference to FIG. 1). The different resonant frequencies will be referred to directly by their respective references.

In one advantageous example, the resonant frequency f11 is positioned in one half, for example the bottom half, of the second harmonic frequency band HB2.

The resonant frequency f12 is positioned in the third harmonic frequency band HB3. The resonant frequency f21 is positioned in the other half, for example the top half, of the second harmonic frequency band HB2.

The resonant frequency f22 is positioned between the fourth harmonic frequency band HB4 and the fifth harmonic frequency band HB5, i.e. in case of overlap of the fourth harmonic and fifth harmonic frequency bands HB4 and HB5, in the common portion of said bands HB4 and HB5.

On the one hand, this provides more than 38 dB of attenuation at the second harmonic frequency band HB2 and more than 40 dB at all of the other harmonics.

Furthermore, this example corresponds to a space-optimised embodiment of the matching and filtering network MFN.

More specifically, given that inductive elements have a much larger size and occupy a much larger space than capacitive elements in this type of embodiment; given that the capacitive elements C0 coupled to ground in the virtual matching network MN0 have lower values near the antenna ANT and higher values near the power amplifier PA; and given that the value of the inductive element required to resonate a capacitive element is inversely proportional to the capacitive value and to the square of the resonant frequency; it is the inductive elements added to resonate the capacitive elements coupled to ground that should be minimised.

The smallest capacitive value C0 is thus firstly associated with the largest resonant frequency, in this example between the fourth harmonic frequency band HB4 and the fifth harmonic frequency band HB5. This minimises the value of the inductive element L, determined by the equation EQ6, of the series LC arrangement 22 of the second section SCT2.

The capacitive element of the first section SCT01 of the virtual network MN0 is then chosen to resonate in the highest harmonic frequency band that has not yet been filtered, i.e. the third harmonic frequency band HB3. This minimises the value of the inductive element L, determined by the equation EQ6, of the series LC arrangement 12 of the first section SCT1, while additionally covering the third harmonic frequency band HB3.

Thus, both of the two inductive elements of the series LC arrangements 12, 22 of the two sections SCT1, SCT2 require minimal overall space, while having resonant frequencies respectively distributed in a manner adapted to attenuate a plurality of harmonic frequency bands HB3, HB4, HB5.

The resonant frequencies of the parallel LC arrangement 11 and T-shaped LC arrangement 30 can then be positioned more freely in the remaining harmonic frequency bands HB2, since the additional space required by the added capacitive elements is small compared to the space required by the inductive elements, in particular compared to the space savings achieved by optimising the inductive elements of the series LC arrangements 12, 22.

The resonant frequencies f11 and f21 are then chosen to be distributed in the second harmonic frequency band HB2, for example a resonant frequency f11, f21 in each half of the band HB2.

The inductive element and the capacitive element of the third section SCT3 are not replaced by a resonant LC arrangement, in order to maintain a certain level of attenuation at high frequencies.

To summarise, the resonant frequencies f22, f12 are firstly chosen for each series LC arrangement so as to be distributed in different harmonic frequency bands of the fundamental frequency band, and so that the series LC arrangements replacing the capacitive elements of the virtual matching network having the smallest capacitive values, have the largest resonant frequencies.

The resonant frequencies are then chosen for each parallel LC arrangement 11, 21 so as to be distributed, with the resonant frequencies of the series LC arrangements 12, 22, in different harmonic frequency bands of the fundamental frequency band.

Graph 52 shows that the maximum loss in the fundamental band FB is in the order of 1.6 dB.

Graphs 53 and 54 show that the real part of the impedance is contained to substantially 10% around, for example, 4.5 ohms, and that the imaginary part is also well contained to substantially 15 pF (picofarads).

Thus, a matching and filtering technique has been described that is advantageous in both size and performance, with very inexpensive passive component arrangements.

To summarise, matching is carried out by a low-pass filter having three sections with a minimum quality factor in order to provide the impedance transformation of the real part.

The imaginary part of the optimum impedance of the power amplifier is produced by the inductive element of the direct current power supply stage.

A capacitive coupling element is added before the antenna to block the direct current voltage. The value thereof is chosen such that it is large enough to have little impact on the impedance transformation.

Harmonic rejection (filtering) is achieved by replacing the series inductive elements with parallel LC arrangements, and by replacing the shunt capacitor with series LC arrangements. The equivalent reactance of the LC arrangements is kept equal to the reactance of the element they replace respectively, in the fundamental frequency band.

The resonant frequencies of the LC arrangements are advantageously chosen as follows:

The first parallel LC arrangement, on the output side of the power amplifier, blocks the top part of the second harmonic band;

The first parallel LC arrangement blocks the bottom part of the second harmonic band;

The first shunt series LC arrangement, on the output side of the power amplifier, discharges the frequencies in the third harmonic band;

The second shunt series LC arrangement discharges the frequencies in the fourth and fifth harmonic bands.

The inductive element and the capacitive element of the last section, on the antenna side, are not replaced by a resonant circuit in order to provide attenuation for higher order harmonics, i.e. greater than five.

The invention claimed is:

1. An integrated circuit comprising:
   a power amplifier configured to provide a signal in a fundamental frequency band;
   an antenna; and
   a matching and filtering network, comprising:
      a first section and a second section, the first section coupled between an output node of the power amplifier and a first intermediate node, the second section coupled between the first intermediate node and a second intermediate node, the first section comprising first inductor-capacitor arrangements, the second section comprising second inductor-capacitor arrangements,
      wherein each of the first inductor-capacitor arrangements and the second inductor-capacitor arrangements are configured to have an impedance matched to an output of the power amplifier at the fundamental frequency band and resonant frequencies adapted to attenuate harmonic frequency bands of the fundamental frequency band and to have an equivalent impedance corresponding to an impedance of a capacitive element adapted for the impedance matching in the fundamental frequency band,
      wherein associated resonant frequencies of each of the first series inductor-capacitor arrangement and the second series inductor-capacitor arrangement are set to be distributed in different harmonic frequency bands of the fundamental frequency band such that the first series inductor-capacitor arrangement and the second series inductor-capacitor arrangement have equivalent impedances corresponding to the impedances of the capacitive elements with the smallest capacitive values have the largest resonant frequencies, and
      a third section coupled between the second intermediate node and an input node of the antenna, the third section comprising third inductor-capacitor arrangements configured to have an impedance matched to the output of the power amplifier at the fundamental frequency band.

2. The integrated circuit of claim 1, wherein the first inductor-capacitor arrangements are further configured to have resonant frequencies lower than the resonant frequencies of the second inductor-capacitor arrangements.

3. The integrated circuit of claim 1,
   wherein the first inductor-capacitor arrangements comprise:
      a first parallel inductor-capacitor arrangement coupled between the output node of the power amplifier and the first intermediate node, and
      a first series inductor-capacitor arrangement coupled between the first intermediate node and a ground node; and
   wherein the second inductor-capacitor arrangements comprise:
      a second parallel inductor-capacitor arrangement coupled between the first intermediate node and the second intermediate node, and
      a second series inductor-capacitor arrangement coupled between the second intermediate node and a ground node.

4. The integrated circuit of claim 3, wherein the associated resonant frequencies of each of the first parallel inductor-capacitor arrangement and the second parallel inductor-capacitor arrangement are chosen to be distributed, with the associated resonant frequencies of each of the first series inductor-capacitor arrangement and the second series inductor-capacitor arrangement in different harmonic frequency bands of the fundamental frequency band.

5. The integrated circuit of claim 3, wherein the first parallel inductor-capacitor arrangement is configured to have a corresponding resonant frequency in one half of the second harmonic frequency band, the second parallel inductor-capacitor arrangement is configured to have a corresponding resonant frequency in the other half of the second harmonic frequency band, the first series inductor-capacitor arrangement is configured to have a corresponding resonant frequency in the third harmonic frequency band, and the second series inductor-capacitor arrangement is configured to have a corresponding resonant frequency between the fourth harmonic frequency band and the fifth harmonic frequency band or in a common portion of the fourth harmonic frequency band and of the fifth harmonic frequency band.

6. The integrated circuit of claim 1, wherein the third inductor-capacitor arrangements are configured to have a minimum quality factor, the third inductor-capacitor arrangements comprising:
an inductive element coupled between the second intermediate node and the input node of the antenna; and
a capacitive element coupled between the input node of the antenna and a ground node.

7. The integrated circuit of claim 1, wherein the third inductor-capacitor arrangements of the third section are configured to have a minimum quality factor.

8. A method for impedance matching and filtering between an output of a power amplifier and an antenna, the power amplifier configured to provide a signal in a fundamental frequency band, the method comprising:
coupling a matching and filtering network between the power amplifier and the antenna, the matching and filtering network comprising:
a first section coupled between an output node of the power amplifier and a first intermediate node, the first section comprising first inductor-capacitor arrangements,
a second section coupled between the first intermediate node and a second intermediate node, the second section comprising second inductor-capacitor arrangements, and
a third section coupled between the second intermediate node and an input node of the antenna, the third section comprising third inductor-capacitor arrangements;
determining inductors and capacitors of the first inductor-capacitor arrangements and the second inductor-capacitor arrangements to have an impedance matched to the output of the power amplifier at the fundamental frequency band and resonant frequencies adapted to attenuate harmonic frequency bands of the fundamental frequency band;
determining inductors and capacitors of the third inductor-capacitor arrangements to have an impedance matched to the output of the power amplifier at the fundamental frequency band; and
determining associated resonant frequencies of each of the first series inductor-capacitor arrangement and the second series inductor-capacitor arrangement to be distributed in different harmonic frequency bands of the fundamental frequency band such that the first series inductor-capacitor arrangement and the second series inductor-capacitor arrangement have equivalent impedances corresponding to the impedances of capacitive elements with the smallest capacitive values and the largest resonant frequencies.

9. The method of claim 8, further comprising:
determining inductors and capacitors of the first inductor-capacitor arrangements to have resonant frequencies lower than the resonant frequencies of the second inductor-capacitor arrangements.

10. The method of claim 8,
wherein the first inductor-capacitor arrangements comprise:
a first parallel inductor-capacitor arrangement coupled between the output node of the power amplifier and the first intermediate node, and
a first series inductor-capacitor arrangement coupled between the first intermediate node and a ground node; and
wherein the second inductor-capacitor arrangements comprise:
a second parallel inductor-capacitor arrangement coupled between the first intermediate node and the second intermediate node, and
a second series inductor-capacitor arrangement coupled between the second intermediate node and a ground node.

11. The method of claim 10, further comprising:
determining the associated resonant frequencies of each of the first parallel inductor-capacitor arrangement and the second parallel inductor-capacitor arrangement to be distributed, with the associated resonant frequencies of each of the first series inductor-capacitor arrangement and the second series inductor-capacitor arrangement in different harmonic frequency bands of the fundamental frequency band.

12. The method of claim 10, further comprising:
determining inductors and capacitors of the first parallel inductor-capacitor arrangement to have a corresponding resonant frequency in one half of the second harmonic frequency band;
determining inductors and capacitors of the second parallel inductor-capacitor arrangement to have a corresponding resonant frequency in the other half of the second harmonic frequency band;
determining inductors and capacitors of the first series inductor-capacitor arrangement to have a corresponding resonant frequency in the third harmonic frequency band; and
determining inductors and capacitors of the second series inductor-capacitor arrangement to have a corresponding resonant frequency between the fourth harmonic frequency band and the fifth harmonic frequency band or in a common portion of the fourth harmonic frequency band and of the fifth harmonic frequency band.

13. The method of claim 8, wherein the third inductor-capacitor arrangements comprising:
an inductive element coupled between the second intermediate node and the input node of the antenna; and
a capacitive element coupled between the input node of the antenna and a ground node.

14. The method of claim 13, further comprising determining the inductive element and capacitive element of the third inductor-capacitor arrangements to have a minimum quality factor.

15. The method of claim 8, wherein the determining of inductors and capacitors of the first inductor-capacitor arrangements and the second inductor-capacitor arrangements comprises:
- choosing resonant frequencies for each series inductor-capacitor arrangement to be distributed in different harmonic frequency bands of the fundamental frequency band, such that series inductor-capacitor arrangements replacing capacitive elements having the smallest capacitive values have the largest resonant frequencies; and
- choosing resonant frequencies for each parallel inductor-capacitor arrangement such that they are distributed, with the resonant frequencies of the series inductor-capacitor arrangements, in different harmonic frequency bands of the fundamental frequency band.

16. A matching and filtering network, the matching and filtering network coupled between a power amplifier configured to provide a signal in a fundamental frequency band and an antenna, the matching and filtering network comprising:
- a first section coupled between an output node of the power amplifier and a first intermediate node, the first section comprising first inductor-capacitor arrangements,
- a second section coupled between the first intermediate node and a second intermediate node, the second section comprising second inductor-capacitor arrangements,
- wherein each of the first inductor-capacitor arrangements and the second inductor-capacitor arrangements is configured to have an impedance matched to the output of the power amplifier at the fundamental frequency band and resonant frequencies adapted to attenuate the harmonic frequency bands of the fundamental frequency band and to have an equivalent impedance corresponding to an impedance of a capacitive element adapted for the impedance matching in the fundamental frequency band, and
- wherein associated resonant frequencies of each of the first series inductor-capacitor arrangement and the second series inductor-capacitor arrangement are chosen to be distributed in different harmonic frequency bands of the fundamental frequency band such that the first series inductor-capacitor arrangement and the second series inductor-capacitor arrangement with equivalent impedances corresponding to the impedances of the capacitive elements with the smallest capacitive values have the largest resonant frequencies, and
- a third section coupled between the second intermediate node and an input node of the antenna, the third section comprising third inductor-capacitor arrangements are configured to have an impedance matched to the output of the power amplifier at the fundamental frequency band.

17. The matching and filtering network of claim 16,
wherein the first inductor-capacitor arrangements comprise:
- a first parallel inductor-capacitor arrangement coupled between the output node of the power amplifier and the first intermediate node, and
- a first series inductor-capacitor arrangement coupled between the first intermediate node and a ground node;

wherein the second inductor-capacitor arrangements comprise:
- a second parallel inductor-capacitor arrangement coupled between the first intermediate node and the second intermediate node, and
- a second series inductor-capacitor arrangement coupled between the second intermediate node and a ground node; and wherein the third inductor-capacitor arrangements are configured to have a minimum quality factor, the third inductor-capacitor arrangements comprising:
- an inductive element coupled between the second intermediate node and the input node of the antenna; and
- a capacitive element coupled between the input node of the antenna and a ground node.

18. The matching and filtering network of claim 17, wherein the associated resonant frequencies of each of the first parallel inductor-capacitor arrangement and the second parallel inductor-capacitor arrangement are chosen to be distributed, with the associated resonant frequencies of each of the first series inductor-capacitor arrangement and the second series inductor-capacitor arrangement in different harmonic frequency bands of the fundamental frequency band.

19. The matching and filtering network of claim 17, wherein the first parallel inductor-capacitor arrangement is configured to have a corresponding resonant frequency in one half of the second harmonic frequency band, the second parallel inductor-capacitor arrangement is configured to have a corresponding resonant frequency in the other half of the second harmonic frequency band, the first series inductor-capacitor arrangement is configured to have a corresponding resonant frequency in the third harmonic frequency band, and the second series inductor-capacitor arrangement is configured to have a corresponding resonant frequency between the fourth harmonic frequency band and the fifth harmonic frequency band or in a common portion of the fourth harmonic frequency band and of the fifth harmonic frequency band.

20. The matching and filtering network of claim 17, wherein the third inductor-capacitor arrangements comprising:
- an inductive element coupled between the second intermediate node and the input node of the antenna; and
- a capacitive element coupled between the input node of the antenna and a ground node.

* * * * *